US005723854A

United States Patent [19]

Berney

[11] Patent Number: 5,723,854

[45] Date of Patent: Mar. 3, 1998

[54] ELECTRONIC LABEL FOR OPTICAL READING/WRITING

[75] Inventor: Jean Claude Berney, Les Charbonnières, Switzerland

[73] Assignee: Gay Freres S.A., Geneva, Switzerland

[21] Appl. No.: 596,156

[22] PCT Filed: Jun. 28, 1995

[86] PCT No.: PCT/CH95/00147

§ 371 Date: Feb. 14, 1996

§ 102(e) Date: Feb. 14, 1996

[87] PCT Pub. No.: WO96/01473

PCT Pub. Date: Jan. 18, 1996

[30] Foreign Application Priority Data

Jul. 4, 1994 [CH] Switzerland .......................... 02120/94

[51] Int. Cl.[6] .................................................. G06K 19/06

[52] U.S. Cl. .............................................................. 235/491

[58] Field of Search ..................................... 235/491, 492

[56] References Cited

U.S. PATENT DOCUMENTS 5,354,979 10/1994 Adelson et al. ........................ 235/491

FOREIGN PATENT DOCUMENTS 2 623 311-A1 5/1989 France .

84 12 803-U1 1/1986 Germany .

OTHER PUBLICATIONS

Patent Abstracts of Japan, vol. 12, No. 233 (P-724), Jul. 5, 1988, abstracting JP 63-025792-A, Urata/Oki Electric of Feb. 3, 1988.

Patent Abstracts of Japan, vol. 11, No. 216 (P-595), Jul. 14, 1987, abstracting JP 62-034291-A, Yamada+/Koito Ind. Co. of Feb. 14, 1987.

Patent Abstracts of Japan vol. 11, No. 216 (P-595), Jul. 14, 1987, abstracting JP 62-034292-A, Yamada/Koito Ind. Co. of Feb. 14, 1987.

Patent Abstracts of Japan, vol. 17, No. 491 (P-1607), Sep. 6, 1993, abstracting JP 51-26570-A, Takada+/Matsushita of May 21, 1993.

Patent Abstracts of Japan vol. 12, No. 235 (P-725), Jul. 6, 1988, abstracting JP 63-027989-A, Harada/Mitsubishi of Feb. 5, 1988.

*Primary Examiner*—F. L. Evans
*Attorney, Agent, or Firm*—Milton Oliver

[57] ABSTRACT

The present invention relates to an electronic label comprising typically a EEPROM-like memory device. Said label comprises electro-optical cells, allowing a power supply of the label when light hits said cells. Electro-optical components allow further to receive optical command signals and to transmit optical signals to the exterior, which light signals relate the content of said memory device.

8 Claims, 4 Drawing Sheets

ELECTRONIC LABEL FOR OPTICAL READING/WRITING

BACKGROUND OF THE INVENTION

At present, there are numerous electronic labels in the marketplace, allowing a memorization of information in relation to an object or to a product. The most simple labels comprise nothing but a memory being only dedicated to reading purposes (ROM) and having e.g. an identification number. More developed systems provide a reading/writing of stored information. Said reading/writing permits modification of stored information as a function of the time evolution of the product, enabling therefore, a traceability. The most simple systems make use of a static memory or read-only memory (ROM) powered by a long-life battery, being e.g. a lithium battery. More sophisticated systems make use of erasable and programmable memories or electrically erasable programmable read-only memories (EEPROM), providing the advantage to keep the information without needing external energy, allowing a omission of the battery. Access to the information is possible by establishing one or more contacts, as it is done for chip cards. However, more and more systems can be read, written or read/written at a distance, without needing any contacts. For doing so, all actually known contactless systems make use of a magnetic coupling, which make use of at least one coil. This method involves several disadvantages.

It is, for example, impossible to mount such a label on a metallic object, representing a magnetic short-circuit, affecting the energy intended to the label. It is, moreover, impossible to place a multitude of labels next to each other, because of the danger of interference. Finally, such a coil represents a relatively voluminous and fragile component.

SUMMARY OF THE INVENTION

The present invention concerns an electronic label for a contactless reading/writing at a distance without having the above disadvantages. Said label comprises at least one electronic memory device being able to retain its status in the absence of power supply. Said label comprises further a command circuit for instructing said memory device. Said label is characterized by a combination of cells alike electro-optical cells being mounted in such a way, to supply said memory device and said command circuit with power, when hit by light on a cell surface. Said label is further characterized by transmission means being connected to said command circuit and transmitting light signals to the exterior, which light signals relate to the content of said memory device.

DESCRIPTION OF THE PREFERRED EMBODIMENTS

Figure 1:
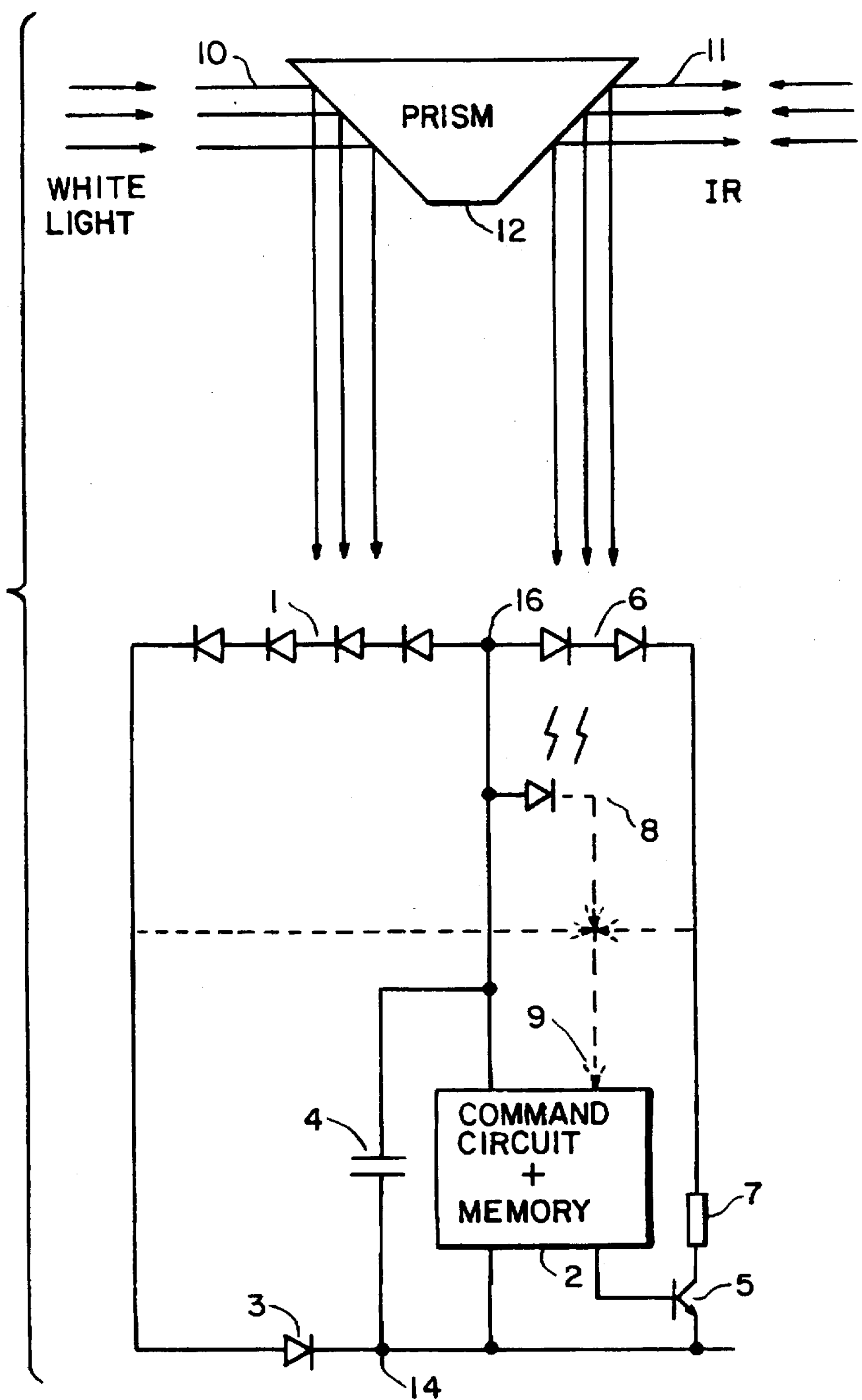
FIG. 1 shows an exemplified functional diagram of the label according to the invention.

According to FIG. 1 are shown four electro-optical cells 1, being e.g. photo-voltaic cells based amorphous silicon or GaAs cells based on crystalline silicon said cells deliver an electric voltage when hit by light. Said voltage allows to supply the memory device and the command circuit 2 with power via a pair of terminals 16, 14. A diode 3 and a capacitor 4, being arranged in between said cells 1 and said memory device and command circuit 2, allow to filter said supply voltage. Preferentially, said command circuit 2 comprises a limitation circuit, allowing to limit said supply voltage in the case of too violent cell illumination. The command circuit 2 is connected to the base contact of a transistor 5. Said transistor 5 supplies transmission means, e.g., two electroluminescence diodes 6. A resistor 7 is arranged in between said transistor 5 and said diodes 6. By means of said electroluminescence diodes 6 it is, therefore, possible to emit light signals to the exterior. Said light signals are relating to the information stored in said memory device and are detectable by known detection means. In the case, when said diodes 6 are infrared (IR) diodes, then a IR detector can be provided, which IR detectors are well known and commonly used for detection of persons. It is also possible to emit light signals by varying the incident light, that means by varying the part of the incident light which is reflected from the label.

According to a most simple embodiment, where the memory device is only a readable memory device, it is possible to turn on the command circuit automatically whenever the supply voltage reaches a sufficient potential. Said turned on command circuit scans permanently through the complete memory and sends corresponding signals to the transistor 5 and from there to the diodes 6. As long as the cells 1 are sufficiently illuminated, it is, therefore, possible to read permanently the content of the memory device.

Unfortunately, the above embodiment does not provide any essential advantage as compared to a simple bar code. A more performing solution consists by using a readable/writable memory device (EEPROM) which retains the stored information in the absence of a power supply.

Thus it is necessary to not only send from the exterior the information to be stored to a memory device, but also to control from the exterior the different steps of the reading and writing process using command signals. Signals from the exterior relate to information and command signals.

One solution consists in a modulation of the incident light being directed onto the label. Such modulations are detectable by detection means like an optical detector being e.g. a photo-diode 8. Detected modulations are processed into signals by the photo-diode 8, which is connected by an input contact 9 of the command circuit 2 to an amplification circuit. The internal configuration of said command circuit 2 is given in more detail according to FIG. 2.

Another and easier solution consists in using a part or the whole of the electro-optical cells 1 for detecting such modulations. Said cells can, effectively, have reaction times sufficiently slow to allow the introduction of information (and of command signals) in the incident light beam. Therefore, short light interruptions can be provided, having a frequency of the order of some kHz and representing modulations (light or dark). Said short interruptions are filtered by means of the diode 3 and of the capacitor 4, in such a way, that their influence on the supply voltage can be neglected. Signals being generated by the cells 1 are applied to the input contact 9 of the command circuit of the memory device 2.

Another even more interesting solution consists in using the electroluminescence diodes 6 as photodetectors. It is well known that such elements can be used in a reversed mode and can, therefore, be used as emitters and as receivers. Such a configuration allows a total separation into a part regarding the energy supply, being represented by the cells 1 and into a part regarding the emission/reception of information (and of command signals), being represented by the diodes 6, 8. Said separation can be also made on the level of the wavelength range of the light. With regards to the energy supply, it is proposed to use a first light component of e.g. white light similar to sunlight. With regards to the emission/reception of information, a second light component of preferentially infra-red (IR) light is used, which results in a selective light band, being less sensible to external perturbations. Reversible diodes 6, being also used as photodetectors, are connected to the input contact 9 of the command circuit 2. The above mentioned three possible interconnections of the input contact 9 are indicated by dotted lines according to FIG. 1.

According to the last cited example, the energy supply occurs in a permanent manner by centering a beam of white light 10 onto the label and the communication of information is made by using a bidirectional IR beam 11. The prism 12 allows to combine said two beams, which is represented in a schematic manner according to FIG. 1.

There are of course numerous other possibilities for generating such light beams and for their transmission to the surface of a label. It is possible to send them in a direct or in an indirect manner to the label, using e.g. an optical fiber.

Figure 2:
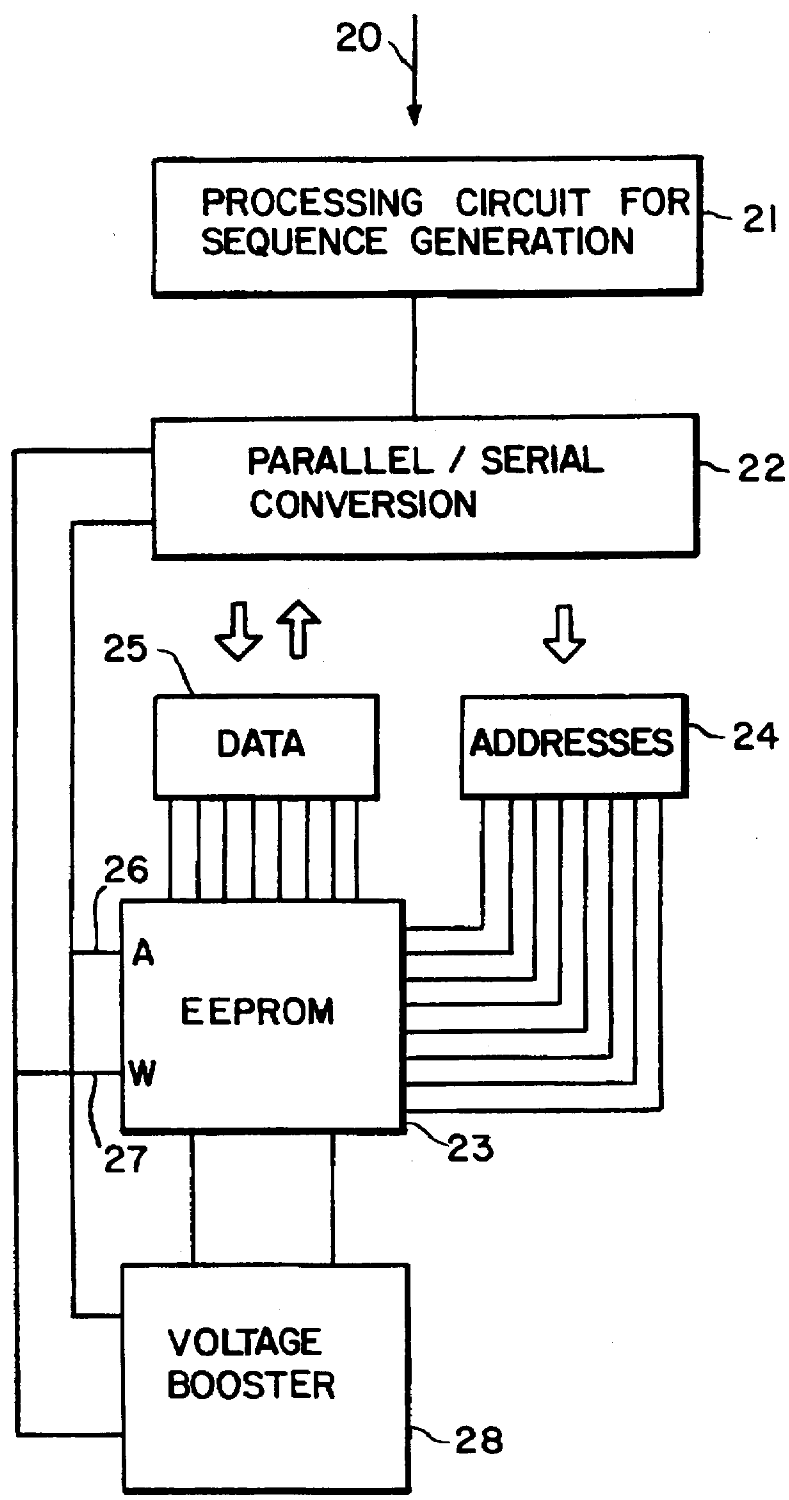
FIG. 2 shows a more detailed exemplified functional diagram of the memory device and its command circuit.

FIG. 2 shows an exemplified internal configuration of the memory device and its command circuit.

Command signals 20 are applied to the input contact of a processing circuit 21. The latter generates the different sequences destined for the functioning of the label and delivers rectangular signals to an input contact of a serial/parallel converter 22. Information is transmitted from the exterior in a serial way using light beams. Said converter is mounted in a way to decode said transmitted information. Said decoded information allows a command of the memory device 23, comprising address inputs 24, data input/outputs 25, a reading input 26 and a writing input 27. Said memory device (EEPROM) comprises normally a voltage increasing booster 28, which is switched on during a writing process for fixing newly registered data. There are numerous known configurations of this kind and for this reason, no further details will be given.

Figure 3A:
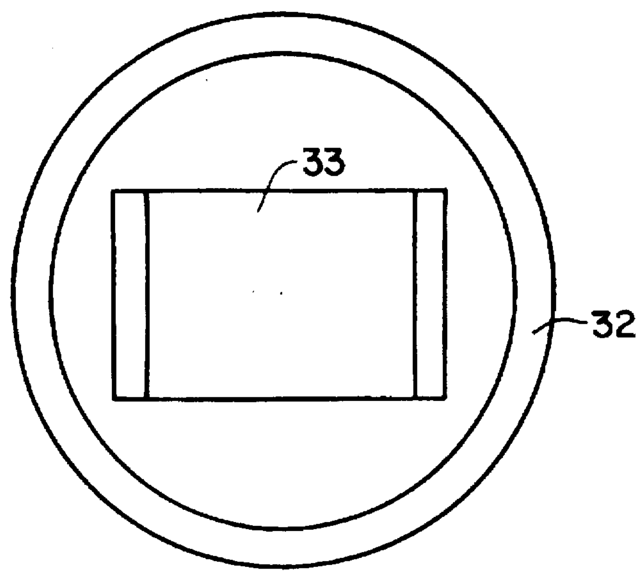
FIGS. 3A, 3B, and 3C are respectively a bottom view, a cross-sectional side view, and a top view of a preferred embodiment of the electronic label according to the invention.
Figure 3B:
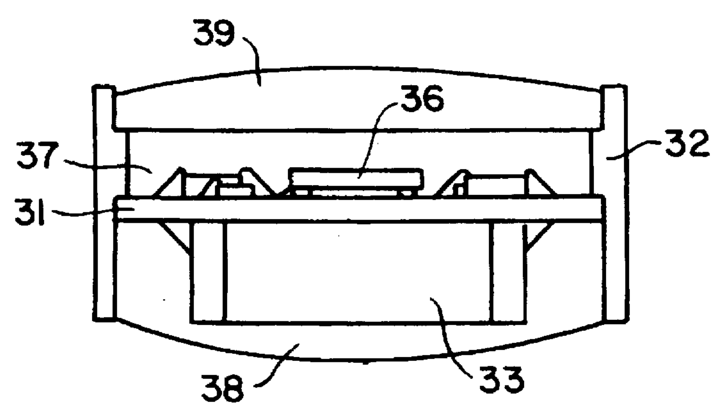
Figure 3C:
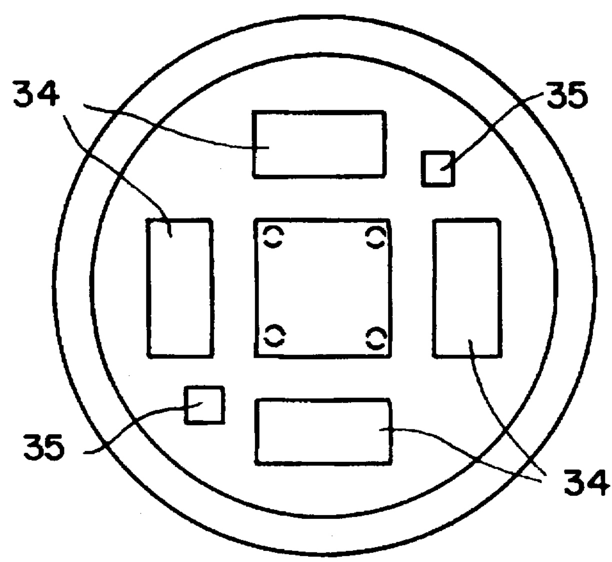

FIGS. 3A–3C show an exemplified embodiment of the label according to the invention.

According to said figure, different electronic elements are mounted on a substrate or support 31 being fixed in a tubular case 32. A first side of the support 31 comprises a capacitor 33, which corresponds to the capacitor 4 according to FIG. 1. On a second side of the support 31 comprises four electro-optical photocells 34, two electroluminescence diodes 35, an integrated circuit 36 comprising a command circuit and a memory device and a diode 3 according to FIG. 1.

According to a classic embodiment, the support 31 can be a double sided printed circuit comprising interconnections in between the different components. The capacitor 33, being e.g. a SMD, capacitor, is welded directly to the printed circuit. Said printed circuit 31 can include bumps for securing by thermocompression, while the electro-optical elements are connected by bonding 37.

The above assembly is given as example for a better understanding of the invention. With regards to microassembling methods, we observe at present rapid progress, enabling e.g. bringing together of a plurality of elements on one and the same substrate, and reducing, therefore, the number of components and interconnections. In the future, we can await remarkable simplifications in this domain.

In the following will be discussed the dimensioning of such labels. Simple light sources like e.g. diode lasers can emit a light beam with a typical intensity of the order of magnitude of 100 mW per $cm^2$. Known electro-optical cells have an efficiency of 10%. It is, therefore, possible to obtain an electric power of 0.1 mW per $mm^2$ cell surface.

In order to write a byte into a memory device EEPROM, it is necessary to switch on a voltage increasing booster and to furnish a certain power. The electro-optical cells must deliver a typical power of 2.5 mW during 2.5 msec (Faselec).

In order to transmit information to the exterior, electroluminescence diodes must be supplied with typically at least 1 mA, enabling the latter to emit light signals which can be detected easily and representing a power consumption of 5 mW at 5 Volts.

In order to generate said power, it would be necessary to have a total cell surface of 50 $mm^2$, resulting in a relatively large and expensive label. A simple method to avoid said disadvantage consists in operating the label in time intervals. Light signals are written or sent only at very short time periods. The filter capacitor is, therefore, discharged over very short time periods and can be recharged afterwards during longer time periods, reducing the mean power consumption.

The writing of 1 byte consumes e.g. 2.5 mW during 2.5 msec. In order to reduce the mean power consumption, the capacitor is recharged during e.g. 7.5 msec, resulting in a total writing time of 10 msec. The corresponding mean power consumption relates to 2.5 mW*2.5/(2.5+7.5)=0.625 mW.

The transmission of signals to the exterior consumes 5 mW. As IR diodes can be modulated at high speed, allowing to send a byte within a few milliseconds, the mean power consumption decreases of high speed modulated IR diodes is easily reduced to 10% of the peak value, that means to 0.5 mW.

The above mentioned different cyclic relationships can be generated directly by the command circuit according to FIG. 2.

It is, therefore, possible to reduce the necessary total cell surface by a factor 8 to 10, representing a cell surface of e.g. four cells with 2 $mm^2$ surface each. The integrated circuit comprising a command circuit and the related diode typically need a surface of 4 $mm^2$ (techno Faselec SAC MOS 2 microns, 256/8 bit capacitor). In what concerns the electroluminescence diodes, they need a surface of less than 0.5 mm/0.5 mm.

For a writing procedure, the capacitor produces a current of 0.5 mA during 2.5 msec. In order to limit the potential drop to an acceptable value, the capacity of the capacitor must be of the order of magnitude of some microFarad. It is proposed to use a SMD capacitor with a minimum size of 1812.

The above made power evaluations correspond to the present state of the art and to actually commercially available components. It is e.g. foreseen to put EEPROM memory devices on the marketplace, which consume 10 times less power for a writing procedure and which, therefore, will reduce the label dimensions.

In the present case, the complete label is mounted in a tubular case 32, having a diameter of 8 mm and a height of 4 mm (scale factor of 8), as shown by the embodiment according to FIG. 3. The case is sealed on one side by a resin droplet 38 and on the other side by a transparent lens 39. The latter is fixed in a recess of the case.

Figure 4:
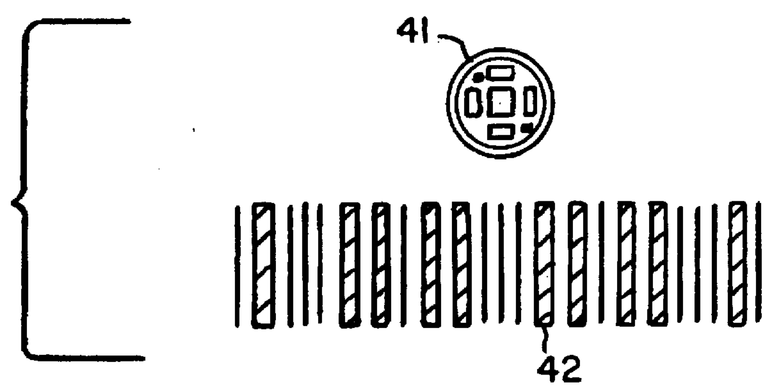
FIG. 4 shows an exemplified label according to the invention being combined with a bar code.

FIG. 4 shows an exemplified label according to the invention being combined with a bar code. In order to make use of the label according to the invention, a light beam has to be sent and light signals will be received as reply. There is, therefore, a great analogy with the means necessary for reading a bar code. The label 41 according to the invention can be, without any difficulty, combined with a bar code 42. The latter represents an unchangeable information part, while the label according to the invention represents a changeable information part.

Figure 5:
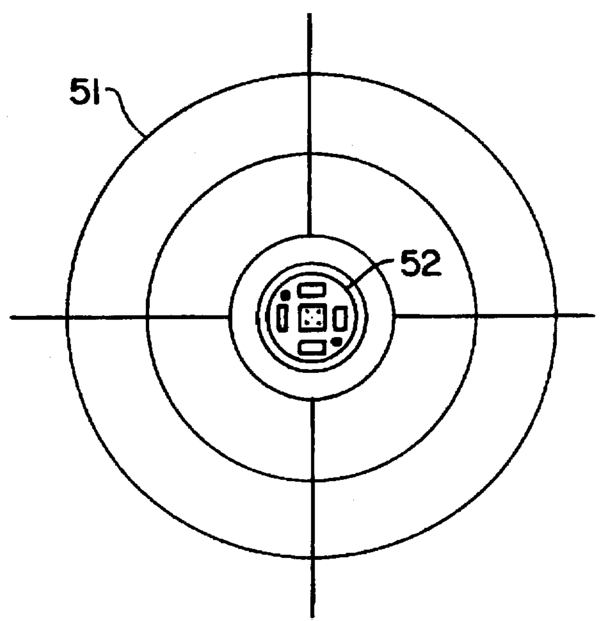
FIG. 5 shows an exemplified label according to the invention being combined with a crosshair for optical pointing purposes.

FIG. 5 shows an exemplified label according to the invention being combined with a crosshair for optical pointing purposes. It is well known that, recently, image recognition means progress rapidly. Such means allow e.g. a high precision positioning. With regards to the present invention and in accordance with FIG. 5, such image recognition means, being associated with a crosshair 51, enable a high precision positioning by pointing at said crosshair. It is, therefore, possible to place a label 52 in the center of said crosshair 51 and to point the light beam with precision at said label.

There are of course numerous other possible combinations for making a label according to the invention. A description of such labels does not, however, bring forward any new elements for the understanding of the functioning.

What is claimed is:

1. Electronic label, comprising a plurality of photocells (1, 34) responsive to white light and connected together to convert said white light into an operating voltage across a pair of terminals (14, 16);

a receiving diode (8, 35), responsive to a light wavelength range other than said white light, powered by said pair of terminals, and furnishing information received as a modulation of light in said other wavelength range, at least one electronic memory device capable of retaining stored information in the absence of power supply, and a command circuit (2) for instructing said memory device, coupled to said pair of terminals, and having an input connected to an output of said receiving diode (8, 35), and a light-emitting transmission means (6, 35), powered by said pair of terminals and having an input connected to an output of said memory device, for reading out information stored in said memory device, as commanded by said command circuit (2).

2. Electronic label according to claim 1, wherein said transmission means comprises at least one electroluminescent diode (6).

3. Electronic label according to claim 1, further comprising a crosshair pattern (51) surrounding said electronic label (52), thereby facilitating location of said label (52) by an image detection and recognition means for purposes of pointing a light beam at the electronic label.

4. Electronic label according to claim 1, wherein said other wavelength range is an infra-red wavelength range.

5. Electronic label according to claim 1, further comprising a substrate (31) supporting said photocells (1, 34), receiving diode (6, 35), memory device, command circuit (2, 36), and transmission means (8,35).

6. Electronic label according to claim 5, further comprising a transparent lens (39) covering a first major surface of said substrate (31) and components mounted thereon.

7. Electronic label according to claim 5, further comprising a capacitor (4, 33) mounted on a second major surface of said substrate (31), remote from said photocells (1, 34).

8. Electronic label according to claim 5, wherein said substrate is a printed circuit board.

* * * * *